US006933540B2

(12) United States Patent
Liu et al.

(10) Patent No.: US 6,933,540 B2

(45) Date of Patent: Aug. 23, 2005

(54) ESD PROTECTION APPARATUS AND METHOD FOR DUAL-POLARITY INPUT PAD

(75) Inventors: Meng-Huang Liu, Hsinchu (TW); Chun-Hsiang Lai, Taichung (TW); Shin Su, Taipei (TW); Tao-Cheng Lu, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/606,922

(22) Filed: Jun. 27, 2003

(65) Prior Publication Data

US 2004/0027744 A1 Feb. 12, 2004

(30) Foreign Application Priority Data

Jul. 1, 2002 (CN) ........................................ 12140160 A

(51) Int. Cl.[7] ................................................ H01L 29/72

(52) U.S. Cl. ....................... 257/173; 257/111; 257/109; 257/355

(58) Field of Search ................................. 257/355, 356, 257/361–363, 107, 109, 111, 173, 112

(56) References Cited

U.S. PATENT DOCUMENTS

| | | | | |
|---|---|---|---|---|
| 5,012,317 A | * | 4/1991 | Rountre | 257/173 |
| 5,959,821 A | * | 9/1999 | Voogel | 361/111 |
| 6,258,634 B1 | * | 7/2001 | Wang et al. | 438/133 |

* cited by examiner

*Primary Examiner*—Tom Thomas
*Assistant Examiner*—Matthew C. Landau
(74) *Attorney, Agent, or Firm*—Rabin & Berdo, PC

(57) ABSTRACT

An ESD protection apparatus for dual-polarity input pad comprises a triple-well formed with a first, second and third regions to form an SCR structure. A first and second ground connection regions of opposite conductivity types are formed on the first region, a first and second input connection regions of opposite conductivity types are formed in the third region, and a bridge region is formed across the second region and extends to the first and third regions. Under normal operation, the first, second, and third regions form two back-to-back diodes. Under positive polarity ESD event, breakdown is occurred between the bridge and first regions to thereby trigger an SCR circuit for positive polarity ESD protection. Under negative polarity ESD event, breakdown is occurred between the bridge and third regions to thereby trigger an SCR circuit for negative polarity ESD protection.

12 Claims, 8 Drawing Sheets

ESD PROTECTION APPARATUS AND METHOD FOR DUAL-POLARITY INPUT PAD

FIELD OF THE INVENTION

The present invention relates generally to an electro-static discharge (ESD) protection apparatus and method, and more particularly to an ESD protection apparatus and method for dual-polarity input pad.

BACKGROUND OF THE INVENTION

In semiconductor memories, especially for erasable programmable read only memory (EPROM) and flash memory, some program/erase schemes thereof require negative supply voltages in addition to positive supply voltages. Typically, such negative voltages are supplied by use of charge-pumping circuits. However, the charge-pumping circuit occupies large chip area. To economize the area of silicon wafer, it is desired for circuit designers to have negative voltages supplied directly from appropriate pins during programming/erasing.

On the other hand, N-type device formed in P-type substrate or well connected between input pad and ground pad is usually served as ESD protection apparatus with the P-type substrate or well grounded under normal operation. FIG. 1 shows an ESD protection apparatus 10 for example implemented with NMOS, in which P+ region 14 and N+ regions 16 and 18 are formed on P-type substrate or well 12 with a gate 20 for ESD protection apparatus above the channel between the N+ regions 16 and 18, the N+ region 16 connected to input pad 22, and the N+ region 18 and P+ region 14 connected to ground pad 24. In the structure 10, however, a parasitic diode 26 is formed with the N+ region 16 and P-type substrate or well 12 between the input pad 22 and ground pad 24 and subsequently limits the applied negative voltage lower than −0.7V due to the forward-biased parasitic diode 26. Unfortunately, the negative supply voltage may be high up to −7V depending on the programming/erasing for various applications. It is therefore desired an ESD protection apparatus for dual-polarity supply voltages.

SUMMARY OF THE INVENTION

One object of the present invention is to disclose an ESD protection apparatus and method for dual-polarity input pad.

An ESD protection apparatus and method for dual-polarity input pad, according to the present invention, comprises formation of a silicon controlled rectifier (SCR) structure on a semiconductor substrate, which includes two semiconductor regions of first conductivity type inserted with another semiconductor region of second conductivity type opposite to the first conductivity type therebetween, preferably in the manner of a triple-well made by complementary metal-oxide semiconductor (CMOS) process. On the two semiconductor regions of the first conductivity type, a first and a second electrode connection regions of opposite conductivity types are formed and connected to the input pad and ground pad, respectively. A further region of the second conductivity type bridges across the semiconductor region of the second conductivity type between the two semiconductor regions of the first conductivity type and extends to the two semiconductor regions of the first conductivity type. Under normal operation, whether for positive polarity or for negative polarity, the structure in the apparatus forms two back-to-back diodes that will eliminate the forward-biased parasitic diode during supplied with negative voltage. Under positive polarity ESD event, the junction at the bridge region will break down and, as a result, produce a plurality of carriers, by which the holes will induce a current to trigger an SCR for positive polarity ESD protection. On the other hand, under negative polarity ESD event, the junction at the bridge region will break down and thus produce a plurality of carriers, by which the holes will induce a current to trigger another SCR for negative polarity ESD protection.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
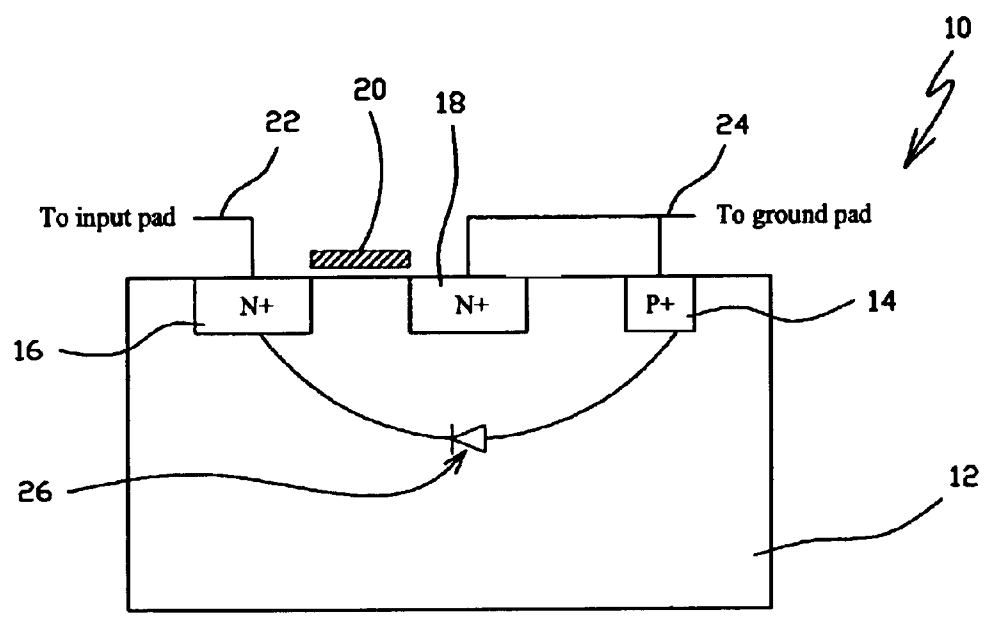
FIG. 1 shows a prior art ESD protection apparatus implemented with NMOS.
Figure 2:
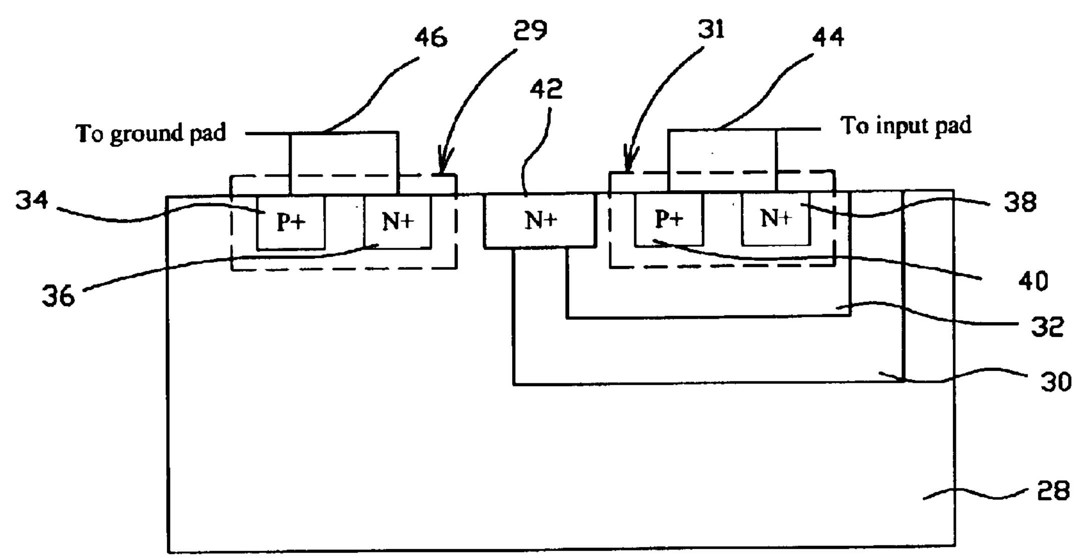
FIG. 2 is a preferred embodiment according to the present invention.

FIG. 2 is a preferred embodiment of the present invention. A deeper N-type well 30 is formed in a P-type substrate or well 28, and a P-type well 32 is further formed in the N-type well 30. Hence, the P-type substrate or well 28, N-type well 30, and P-type well 32 form a triple-well structure, which can be obtained by CMOS process. A ground connection region 29 is formed on the P-type substrate or well 28, which includes P+ region 34 and N+ region 36 both connected to a ground pad 46. An input connection region 31 is formed on the P-type well 32, which includes N+ region 38 and P-type region 40 both connected to an input pad 44. An N+ region 42 is formed across the N-type well 30 and extends to the P-type substrate or well 28 and P-type well 32.

Figure 3:
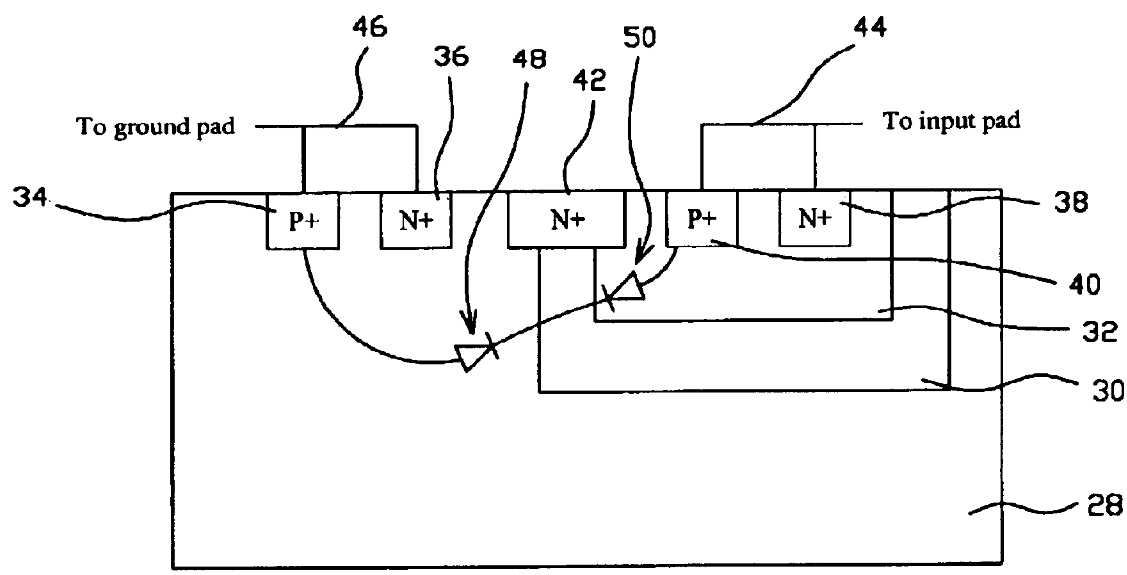
FIG. 3 shows the parasitic back-to-back diodes in the apparatus of FIG. 2 under normal operation.

As shown in FIG. 3, under normal operation, there will be formed, in the apparatus of FIG. 2 by the P-type substrate or well 28, N-type well 30 and P-type well 32, two parasitic diodes 48 and 50 back-to-back connected between the ground pad 46 and input pad 44, which will eliminate the forward-biased parasitic diode during supplied with negative voltage.

Figure 4:
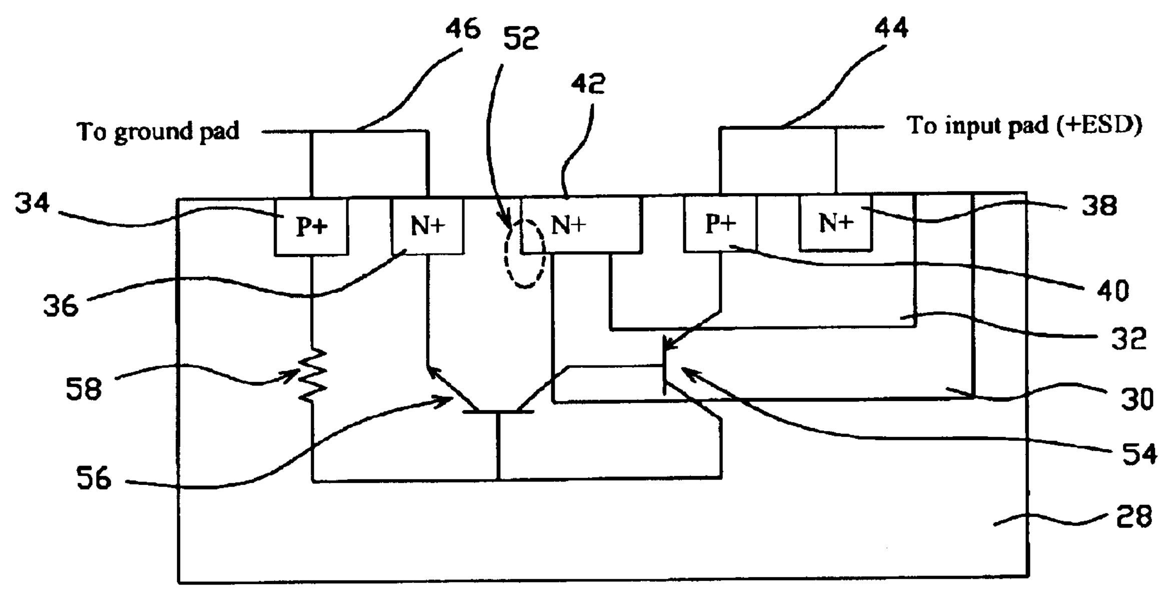
FIG. 4 shows the SCR in the apparatus of FIG. 2 under positive polarity ESD event.
Figure 5:
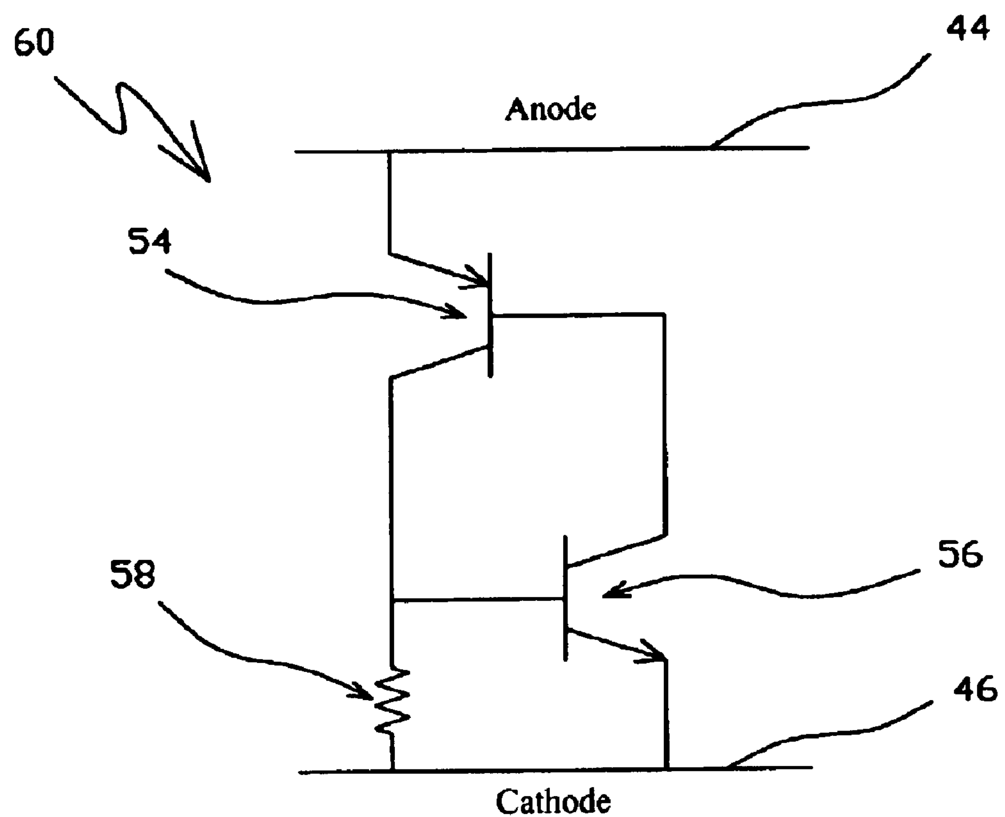
FIG. 5 is an equivalent circuit of the SCR shown in FIG. 4.

Under positive polarity ESD event, as shown in FIG. 4, the P-type substrate or well 28, N-type well 30 and P-type well 32 form an SCR structure with the P+ region 40 embedded in the P-type substrate or well 28 as the anode of the SCR and the N+ region 36 embedded in the P-type substrate or well 28 as the cathode of the SCR. Moreover, the bridge region 42 across the N-type well 30 will lower the breakdown voltage and thus lower the triggering voltage of the induced SCR. When a positive polarity ESD pulse applied on the input pad 44, the junction between the P-type well 32 and N-type well 30 is forward-biased at first. A parasitic PNP transistor 54 appears with the P-type well 32 as its emitter, the N-type well 30 as its base, and the P-type substrate or well 28 as its collector. Due to the P-type substrate or well 28 grounded through the P+ region 34, the vertical PNP transistor 54 is turned on, for the emitter-base is forward-biased and the collector-base is reverse-biased. When the voltage drop across the bridge region 42 and P-type substrate or well 28 reaches the breakdown voltage of the PN junction 52, a plurality of carriers are produced and the produced holes will flow toward the cathode, i.e., P+ region 34. Further, due to the substrate resistance 58, the hole current component will pull high the voltage of the P-type substrate or well 28 to the cathode 34, resulting in the PN junction between the P-type substrate or well 28 and N+ region 36 connected to the cathode forward-biased. This makes a parasitic NPN transistor 56 formed with the N+ region 36, P-type substrate or well 28, and N-type well 30, which is turned on with the N+ region 36 as the emitter, the P-type substrate or well 28 as the base, and the N-type well 30 as the collector. Once the parasitic PNP and NPN transistors 54 and 56 are turned on, the SCR structure will be triggered due to positive feedback procedure, and in FIG. 5 is shown the equivalent circuit 60 of the SCR structure under positive polarity ESD pulse.

Figure 6:
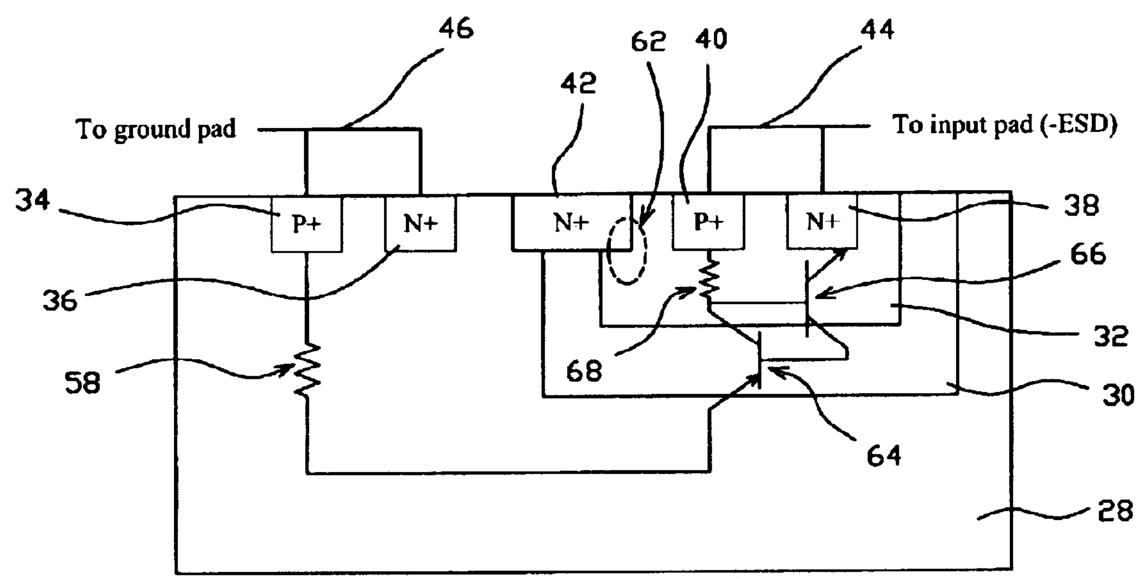
FIG. 6 shows the SCR in the apparatus of FIG. 2 under negative polarity ESD event.
Figure 7:
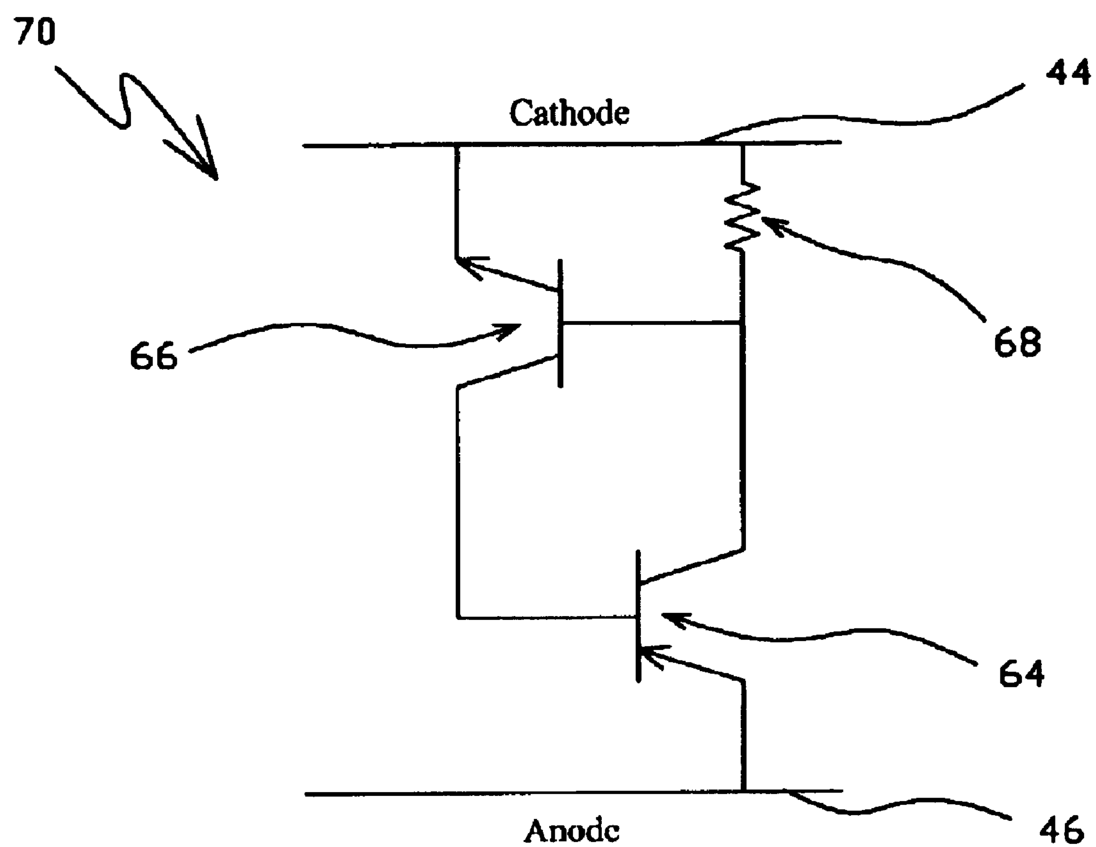
FIG. 7 is an equivalent circuit of the SCR shown in FIG. 6.

Under negative polarity ESD event, as shown in FIG. 6, the P-type substrate or well 28, N-type well 30, and P-type well 32 form an SCR structure with the N+ region 38 embedded in the P-type well 32 as the cathode of the SCR and the P+ region 34 embedded in the P-type substrate or well 28 as the anode of the SCR. Moreover, the bridge region 42 across the N-type well 30 will lower the breakdown voltage and thus lower the triggering voltage of the SCR. When a negative polarity ESD pulse applied on the input pad 44, the junction between the P-type substrate or well 28 and N-type well 30 is forward-biased and the junction between the P-type well 32 and N-type well 30 is reverse-biased. A parasitic PNP transistor 64 is formed with the P-type substrate or well 28, N-type well 30, and P-type well 32 and with the P-type substrate or well 28 as the emitter, the N-type well 30 as the base, and the P-type well 32 as the collector. For the applied negative voltage almost across the P-type well 32 and N-type well 30, the vertical PNP transistor 64 is turned on. When the voltage drop across the bridge region 42 and P-type well 32 reaches the breakdown voltage of the PN junction 62, a plurality of carriers are produced and the produced holes will flow toward the cathode, i.e., P+ region 40. Due to the well resistance 68, the hole current component will pull high the voltage of the P-type well 32 to the cathode 40, resulting in the PN junction between the P-type well 32 and N+ region 38 connected to the cathode forward-biased. As such, a parasitic NPN transistor 66 formed with the N+ region 38, P-type well 32, and N-type well 30 is turned on with the N+ region 38 as the emitter, the P-type well 32 as the base, and the N-type well 30 as the collector. Once the parasitic PNP and NPN transistors 64 and 66 are turned on, the SCR structure will be triggered due to positive feedback procedure, and in FIG. 7 is shown the equivalent circuit 70 of the SCR structure under negative polarity ESD pulse.

Figure 8:
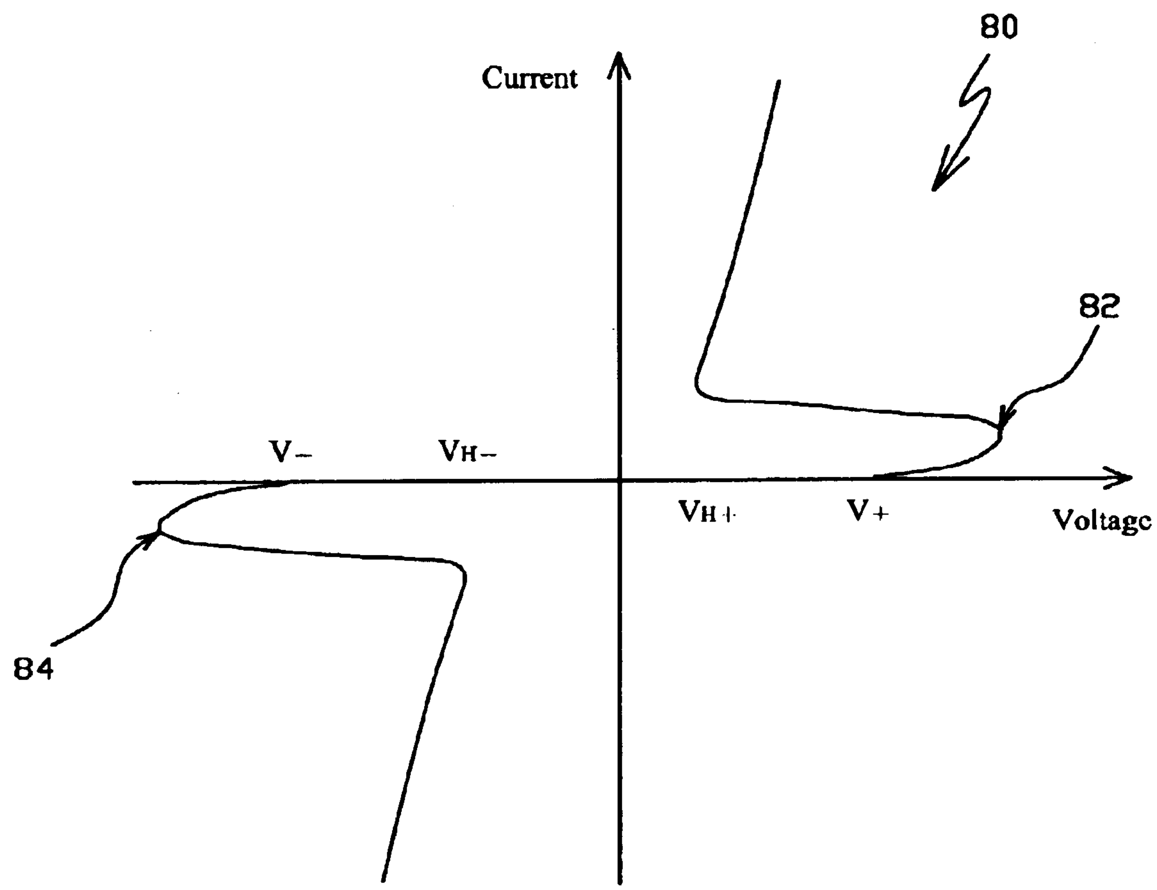
FIG. 8 shows the dual-polarity I-V curve for the apparatus of FIG. 2.

FIG. 8 shows the dual-polarity I–V curve of the above embodiment apparatus. When applied with positive voltage, the voltage increases from V+ to the breakdown point 82 and then rapidly decreases to the holding voltage VH+, and the current will rapidly increases with the voltage after the holding point VH+. When applied with negative voltage, the voltage decreases from V− to the breakdown point 84 and then rapidly increases to the holding voltage VH−, and the current will rapidly increase with the voltage after the holding point VH−. This curve 80 is, however, asymmetrical between the positive and negative polarity regions, since the SCR structures thereof are asymmetrical PNPN structures. Even so, the low holding voltages for each polarity region are appreciated, and effective dual-polarity ESD protection is available.

From the above embodiment, CMOS triple-well process is used to form the silicon controlled rectifier (SCR) structure, and by use of triple-well, the parasitic diode between the input pad and ground pad is removed and more negative voltage can be inputted. With this silicon controlled rectifier, the superior ESD performance can be obtained with small device.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. An ESD protection apparatus for dual-polarity input pad, comprising:

a first region of a first conductivity type;

a second region of a second conductivity type opposite to said first conductivity type formed in said first region;

a third region of said first conductivity type formed in said second region;

a first input connection region of said first conductivity type and a second input connection region of said second conductivity type both formed in said third region; and a first ground connection region of said first conductivity type and a second ground connection region of said second conductivity type both formed in said first region, at locations that do not overlap the second region or the third region.

2. An ESD protection apparatus of claim 1, further comprising a bridge region of said second conductivity type across said second region and extending to said first and third regions.

3. An ESD protection apparatus of claim 1, wherein said first region is provided by a semiconductor substrate.

4. An ESD protection apparatus of claim 1, wherein said first, second, and third regions are arranged in a triple-well manner.

5. An ESD protection apparatus of claim 1, wherein said first and second input connection regions are connected to an input pad, and said first and second ground connection regions are connected to a ground pad.

6. An ESD protection apparatus of claim 1, wherein said first input connection region, third region, second region, first region, and first and second ground connection regions form an SCR circuit under a positive polarity ESD event.

7. An ESD protection apparatus of claim 1, wherein said first and second input connection regions, third region, second region, first region, and first ground connection region form an SCR circuit under a negative polarity ESD event.

8. An ESD protection apparatus of claim 1, wherein said first, second and third regions form two back-to-back diodes under a normal operation.

9. An ESD protection apparatus of claim 2, wherein said bridge region breaks down to said first region under a positive polarity ESD event.

10. An ESD protection apparatus of claim 2, wherein said bridge region breaks down to said third region under a negative polarity ESD event.

11. An ESD protection apparatus of claim 6, wherein breakdown of a junction between said second and third regions is forced under a positive polarity ESD event.

12. An ESD protection apparatus of claim 7, wherein breakdown of a junction between said first and second regions is forced under a negative polarity ESD event.

* * * * *